United States Patent [19]
Levite et al.

[11] Patent Number: 5,493,076
[45] Date of Patent: Feb. 20, 1996

[54] STRUCTURE FOR REPAIRING SEMICONDUCTOR SUBSTRATES

[75] Inventors: James M. Levite, Goshen; Michael Berger, Gardiner; Richard L. Chartrand, Hyde Park; Mary A. Emmett; Raymond A. Jackson, both of Poughkeepsie; James J. Petrone, Hyde Park; Richard F. Shortt, LaGrangeville; Roger A. Stinemire, Saugerties, all of N.Y.

[73] Assignee: International Business Machines Corporation, Armonk, N.Y.

[21] Appl. No.: 378,411

[22] Filed: Jan. 26, 1995

Related U.S. Application Data

[62] Division of Ser. No. 137,547, Oct. 15, 1993.
[51] Int. Cl.$^6$ .......................................................... H05K 1/18
[52] U.S. Cl. ........................... 174/261; 174/251; 29/846; 29/853; 29/850
[58] Field of Search ..................................... 174/251, 256, 174/257, 259, 261; 29/846, 852, 853, 850

[56] References Cited

U.S. PATENT DOCUMENTS

| | | | |
|---|---|---|---|
| 2,837,619 | 6/1958 | Stein | 201/63 |
| 3,499,215 | 3/1970 | Fetterolf et al. | 29/604 |
| 3,764,486 | 10/1973 | Tinklenberg et al. | 204/12 |
| 3,981,076 | 9/1976 | Nicolas | 29/262 |
| 4,259,367 | 3/1981 | Dougherty, Jr. . | |
| 4,418,264 | 11/1983 | Thorwarth . | |
| 4,572,941 | 2/1986 | Sciaky et al. . | |
| 4,630,355 | 12/1986 | Johnson . | |
| 4,704,304 | 11/1987 | Amendola et al. . | |
| 4,880,959 | 11/1989 | Baum et al. . | |
| 4,919,971 | 4/1990 | Chen . | |
| 5,182,230 | 1/1993 | Donelon et al. . | |
| 5,184,399 | 2/1993 | Ueno et al. | 29/846 |
| 5,250,759 | 10/1993 | Watson | 174/261 |
| 5,369,881 | 12/1994 | Inaba et al. | 29/846 |

FOREIGN PATENT DOCUMENTS 5218619  1/1992  Japan .

OTHER PUBLICATIONS

Mutnick, S., "Repairing Breaks in Printed Circuits", IBM Technical Disclosure Bulletin, vol. 8, No. 11, p. 1469 (Apr. 1966).
Tappen, F. M., "Open Conductor Repair for Glass Metal Module", IBM Technical Disclosure Bulletin, vol. 14, No. 10. p. 2915 (Mar. 1972).
Mackey, R. E., "Conductive Line Jumper/Repair Connection in Glass Metal Module", IBM Technical Disclosure Bulletin, vol. 15, No. 8, p. 2423 (Jan. 1973).
Bakos, P. et al., "Circuit Repair/Work of Metallized Polyimide Substrates", IBM Technical Disclosure Bulletin, vol. 22, No. 9, pp. 3986–3987 (Feb. 1980).
Anderson, C. J. et al., "Josephson Package Repair", IBM Technical Disclosure Bulletin, vol. 26, No. 12, pp.

(List continued on next page.)

*Primary Examiner*—Laura Thomas
*Attorney, Agent, or Firm*—Aziz M. Ahsan

[57] ABSTRACT

The present invention relates generally to a new structure and a method for repairing semiconductor substrates, and more particularly, the invention encompasses a structure and a method for repairing Printed Circuit Boards or other electronic substrates by providing electrical lines on the defective board. On a substrate that has an open or an electrical discontinuity, after the discontinuity has been established, a portion of the electrical line across from the electrical discontinuity are exposed and one or more trenches or grooves are made between the two or more exposed portions of the electrical line. The two exposed portions of the exposed electrical line is then joined by either an electrical wire that is routed through the trench or using a standard deposition process one or more metals or material are deposited in the open trench to provide or restore electrical continuity and the excess deposition material is removed. This invention also provides means for impedance matching of the net that is repaired.

13 Claims, 1 Drawing Sheet

OTHER PUBLICATIONS

6244–6245 (May 1984).
Gobran, F., "Tailless Thermo–Compression Bonding", IBM Technical Disclosure Bulletin, vol. 27, No. 5, p. 3041 (Oct. 1984).

"Laser Ablative Cleaning of Bonding Surfaces", IBM Technical Disclosure Bulletin, vol. 32, No. 4A, pp. 429–430 (Sep. 1989).

STRUCTURE FOR REPAIRING SEMICONDUCTOR SUBSTRATES

CROSS-REFERENCE TO A RELATED PATENT APPLICATION

This Patent Application is a Divisional of U.S. patent application Ser. No. 08/137,547, filed on Oct. 15, 1993.

FIELD OF THE INVENTION

The present invention relates generally to a new structure and a method for repairing semiconductor substrates, and more particularly, the invention encompasses a structure and a method for repairing Printed Circuit Boards or other electronic substrates by providing electrical lines on the defective board. An impedance matching method and structure is also disclosed.

BACKGROUND OF THE INVENTION

With the advent of modern day electronics, the circuits on a PCB (Printed Circuit Board) or ceramic modules or chips have become more and more dense. As a result the electrical lines or conductor lines are thinner and narrower so that more of them can be placed in a given area. Therefore, the probability of the conductor lines having defects increases and each of the electronic line carriers have to be inspected for faults in the conductor lines. This inspection can be done visually (manually) or automatically, or the lines can also be electrically verified. Once a fault or defect is found, then it has to be located and repaired. Most of the methods presently under use require that the fault or defect be visually located by the operator, and then the defective conductor line is repaired.

The testing and repairing of the conductor lines are among the most critical steps in the packaging technology. This is because the electronic hardware must be reliable and free from defects, as they are very expensive to manufacture and the field failures cannot be repaired easily. To eliminate these immediate and potential defects, tremendous efforts are being made.

The most commonly found defects are opens, or cracks in lines, or shorts between lines. Most defects or faults in a conductor line are due to masking or improper deposition of the conductive material. But they could also be related to other factors, such as impure material or stretching the resolution limits of the line formation process. The redistribution lines may have opens due to contamination, process mishaps and physical damage.

Another reason for opens is due to stresses generated during thermal cycles in the bond and test process used during assembly of PCB or ceramic modules. The electrical lines with cracks and other latent defects may also develop opens. These opens must be repaired in order to use the substrate or module or package which is otherwise electrically good.

Particularly, in the line processing, the electrical redistribution and other interconnection lines are susceptible to defects which could result in the lines being electrically open. Defects could include voids, missing metal, various particle contamination or physical damage. A redundant metal scheme helps to substantially reduce the number of defective lines, but this scheme does not eliminate them entirely. Those lines identified as "open" after electrical test can be repaired by processes such as laser CVD (Chemical Vapor Deposition) prior to a polyimide overcoat process. Occasionally a line becomes "open" during subsequent thermal processing. These defective conductors appear in the module or substrate, after pins, capacitors and chips are joined. If an "open" line should be found at this point, it is essential to repair the defect so that the module or the substrate or the package can be used.

It is disclosed in, "Repairing Breaks in Printed Circuits," IBM Technical Disclosure Bulletin, Vol. 8, No. 11, Page 1469 (April 1966), that small breaks in a line can be repaired by filling the gap in the broken line with a material that is cured at room temperature or higher to form a base conductive material. A conductive metal layer is then electroplated over the base conductive material to complete the repair. Using this process would require that lines to be repaired, on extremely dense packages with chips, capacitors and discrete wires in place, be isolated during electroplating. This would create significant handling and tooling problem.

"Open Conductor Repair For Glass Metal Module," IBM Technical Disclosure Bulletin, Vol. 14, No. 10, Page 2915 (March 1972), discloses another method of making open repairs. Here a metal line to be transferred is aligned over the open or break, and using a laser beam, a portion of the metal layer is welded to each end of the broken line. This article also teaches that the line could be reflowed into the break using a laser or it could be evaporated into the break. Each of these features cannot be used with the present invention, because melting of high temperature conductive metals, such as copper, is used. Energy required to melt such lines by laser would damage polyimide adjacent to the lines to be repaired.

A rather complex process for repairs of opens is disclosed in U.S. Pat. No. 4,259,367 (Dougherty, Jr.), where a conductor patch line is interconnected onto a good line through an insulating layer. This requires the addition of new wiring layers with photolithographic techniques which would be incompatible with a substrate with components already in place.

Another method of repairing opens is by decal transfer as disclosed in U.S. Pat. No. 4,704,304 (Amendola, et al.), and presently assigned to IBM Corporation.

Still another method of electric circuit line repairs is taught in U.S. Pat. No. 4,630,355 (Johnson). A layer of phase-change material is deposited prior to the deposition of the conductive line and in case an open results in the conductive line, a current is passed so that a portion of the phase-change material becomes electrically conductive and makes an electrical bridge across the gap or open. This method is not suitable for repairs on polyimide films due to lack of adhesion of such phase-change materials to polyimide.

In U.S. Pat. No. 4,418,264 (Thorwarth), a specifically shaped metallic part is placed on the conductor path interruption and by means of microresistance welding, the metallic part is welded to the conductor to bridge the interruption. Welding involves melting of the repair material which when used on current "state of the art" electrical polymer packages could cause structural damage to the polymer. Welding also requires the passage of drive currents which would be incompatible with this invention as there may be active devices which are connected to the lines being repaired at different locations.

Another method of repairing opens and narrow necks has been disclosed in U.S. Pat. No. 4,919,971 (Chen). The defective site in the conductor line having a thin portion or a narrow neck does not have to be physically located to initiate the repairs. The process of this invention is self-induced, i.e., the passage of the drive current creates a hot spot at the defective site and conductive material is induced to be deposited at the defective site. The process of this invention is also self-limiting, i.e., when the defect has been repaired, the process will slow down and stop by itself. This technique requires the substrate to be immersed ill a plating bath or be exposed to organometallic vapors which would make it incompatible with line repair processes where the active and passive components have already been mounted on a substrate.

"Conductive Line Jumper/Repair Connection in Glass Metal Module," IBM Technical Disclosure Bulletin, Vol. 15, No. 8, Page 2423 (January 1973), discloses another method of making open repairs. Here after the open has been located, a wire is placed across the open line and the wire is welded to each end of the open line. After welding, the repaired plane is glassed over leaving a surface suitable for developing another circuit layer. This process teaches the repairs of the carrier at the build level, and not at the functional module level. This process also requires the use of high melting point metals and a subsequent sintering of inorganic materials.

Another welding process for repairing of opens is discussed in, "Circuit Repair/Work of Metallized Polyimide Substrates," IBM Technical Disclosure Bulletin, Vol. 22, No. 9, Page 3986 (February 1980). A piece of wire is jumpered across the open and both ends of the jumpered wire are welded to the circuit line, thus yielding a "continuous electrical line." This process also discloses the use of high melting point metals.

Another method of making circuit repairs is disclosed in, "Tailless Thermo-Compression Bonding," IBM Technical Disclosure Bulletin, Vol. 27, No. 5, Page 3041 (October 1984), where the circuit line is repaired by passing an electric current between two electrodes which fuse the circuit line and the repair material together.

"Josephson Package Repair," IBM Technical Disclosure Bulletin, Vol. 26, No. 12, Pages 6244–6245 (May 1984), is another example of making repairs. The faulty circuits are cut out by laser scribing, and the repair of an open is done by cutting the bad line next to the pad and using a third wiring level to reconnect to the proper pads. This process has the limitation of requiring photolithographic techniques to form the new wiring level. Furthermore, additional electrical process steps cannot be done after chips, pins etc, have been attached.

Laser deposition methods are also being developed for repairing circuit opens. As disclosed in U.S. patent application Ser. No. 223,487, filed on Jul. 25, 1988, now U.S. Pat. No. 5,182,230, and presently assigned to IBM Corporation, an open circuit is repaired by laser induced electroplating process based on the thermobattery effect. One tip of the open conductor is heated with a laser beam, and a thermobattery is formed between the hot spot (tip of the conductor) and the cold part (normal section of the conductor). The laser heating of the tip induces the conductive material present in the plating solution to be formed at the hot tip. This process is continued until the growth of the conductive material joins the two open ends of the open, and a continuous electrical path is formed.

Another process for interconnecting thin-film electrical circuits is taught in U.S. Pat. No. 4,880,959, and presently assigned to IBM Corporation. Both ends of the existing circuit are partially ablated at the open defect site with pulses from an excimer laser, and then gold metal is deposited by LCVD (laser chemical vapor deposition). This process makes the repairs right after the electrical deposition, and prior to any subsequent module build (i.e. at the substrate level).

Under some circumstances a laser, as disclosed in U.S. Pat. No. 4,572,941 (Sciaky, et al.), could be used to make spot welds. The laser induced melting can cause structural damage to sensitive dielectrics and adjoining lines.

Printed circuit boards (PCB) or (board) commonly have thousands of very narrow electrical lines buried within multiple layers of the board, connecting nodes together. Current manufacturing techniques/capabilities often cause lines to be open or have a discontinuity on a considerable percentage of total boards manufactured. This open or discontinuity causes the board to be functionally defective and is normally scrapped. However, some boards could be repaired by using above the board discrete wiring, but, above the surface discrete line repair is unsatisfactory because it interferes with operations further down the manufacturing line such as component placement and solder wave. Therefore, certainly a need exists to repair the open or discontinuous lines in a sub-surface manner, and which will exhibit electrical/reliability characteristics equal to the original undamaged line.

This invention also utilizes the use of a double jumper wire for repair of impedance specific internal circuitry which is a further improvement of this invention and which would eliminate the need for the depth of the wire routing trench to be maintained with extreme precision, to ensure proper distance from the internal planes of the board. This procedure also makes the need to have an exact wire diameter to repair depth ratio non-existent.

The board repair process offers a means of repairing faulty internal nets in the board. A typical repair process of this invention would include milling a trench into the board between the endpoints of the net, bonding the first end of the wire, routing and tacking the wire into trench with epoxy, then bonding the second end of the wire. If required, the wire in the trench can also be encapsulated with epoxy. The repaired net can be tested to the desired specifications. Circuit deletion can also be performed to the desired specification.

The thickness, width and pitch of an electrical line in the board are dependant upon the desired electrical properties of the package. Often a single electrical line will vary in shape, width and proximity to adjacent features along its total path. As a result, process defects may result in opens across these electrical lines, as discussed earlier, at a point where the geometry of the line and the distance to the nearest feature could be very close. Again, the distance to the nearest feature vary widely from line to line.

The process and structure of this invention guards against the problems encountered in the prior art. Basically, the location to be repaired is located by methods well known in the art. After the open or location to be repaired has been appropriately site dressed, at least one blind hole or groove or trench is formed on the surface of the semiconductor material, such as the Printed Circuit Board, typically, using an excimer laser. For some situations two or more grooves or trenches or blind holes could be formed at the location to be repaired. The one or more groove or trench is then used to route the electrical wire or the electrically conductive material along or inside the path of the groove or trench. The trench or grooves accommodate the wire or the electrically conductive material and thus eliminate the possibility of inadvertent shorting.

SUMMARY AND PURPOSES OF THE INVENTION

The invention is a novel method and an apparatus for providing a reliable repair of a defective electrical line in a semiconductor item.

Therefore, one purpose of this invention is to provide an apparatus and a method that will provide a reliable repair for an open in a semiconductor item.

Another purpose of this invention is to provide at least one trench adjacent to an open or an area to be repaired.

Still another purpose of this invention is to provide at least one electrically conductive media that will provide electrical continuity to a electrical line while a portion of the electrically conductive media is in a trench adjacent the defective area.

Yet another purpose of this invention is to eliminate shorting of adjacent lines during line repair.

In one aspect this invention comprises a method for repairing electrical lines on a substrate comprising the following steps:

a. locating an electrical line that has a discontinuity and needs to be repaired, b. exposing a portion of said electrical line across each end of said discontinuity, c. forming at least one trench on said substrate between said exposed portions, and d. making an electrical connection between said exposed portion through said at least one trench to restore electrical continuity to said electrical line, and thereby repairing said electrical line.

In another aspect this invention comprises a repaired structure comprising a carrier having at least one electrical line having a discontinuity, at least a portion across each end of said discontinuity being exposed, at least one trench in said carrier between said exposed ends of said discontinuity, an electrical connection routed through said trench and between said exposed ends to provide electrical continuity to said defective electrical line and thereby providing said repaired structure.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
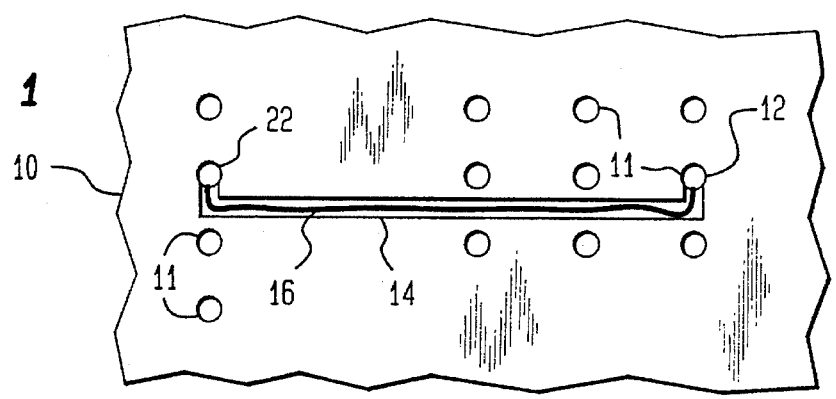
FIG. 1, illustrates a top view of one embodiment of the present invention.

This invention describes various methods of repairing opens and near opens and latent defects in electrical conductor lines.

Latent defects include narrow neck or thin portion or other contamination related defects. The term latent defects as used herein, also means a small portion or section of a conductor line which has a higher resistance per unit length than the normal conductor line. The narrow neck can be of a different shape, for example, the narrow neck could be a local reduction in the line width or a local reduction of line height or thickness or a portion of the line may be made of a material with lower conductivity than that of a normal line. The narrow neck could also include a thin electrical connection of a bridge across an open circuit, or a crack which before stressing does not show up as an open.

An open as understood in the art, is any missing conductor across which current cannot flow or is significantly impeded. This typically establishes a resistance threshold above which the electrical conductive path is considered open.

The method as disclosed by this invention is performed at relatively low temperatures, therefore, this method can be used on substrates with metal/polymer thin film wiring, or other organic materials.

In most cases the protective coating is a polyimide layer or some other dielectric or insulator layer.

Typically, the material for the electrically conductive metal or material for the electrical line is selected from a group comprising aluminum, antimony, bismuth, chromium, cobalt, copper, gold, indium, iron, lead, molybdenum, nickel, palladium, platinum, silver, tantalum, tin, titanium, tungsten, or alloys thereof.

In each case where the conductor line has an open or defect, at least a portion of the conductor line or the attached via must be exposed and prepared by appropriate methods to allow subsequent repair. This is known as site-dressing. In some situations more than one portion of the via or the electrical line will have to be exposed and prepared. In most situations, only a portion of the electrical line or via that will be used in the repair process needs to be exposed and site-dressed. During the site-dressing process it is preferred that at least a portion of the upper surface of the via or the electrical line that is to be repaired is laser ablated, this is done for a number of reasons, such as to clean the upper surface of the electrical line or the via.

Interconnection or repair of electrical circuits can be difficult to make in some instances. For example, the metallurgy in an existing circuit may consist of multiple layers, where the top most layer is a barrier metal, e.g. chromium, that oxidizes and forms a protective, insulating layer. Similarly, the circuit line could have been overcoated with a dielectric material, thus preventing direct access to the site. Before a connection can be made in such circumstances, the protective layer(s) must be removed, and in such a way that a good mechanical and electrical contact can be made between the repair or interconnection metallurgy and the existing circuitry. In the operations required for repair using wire or solder, or combinations thereof, the removal process must also create a surface consistent with the additive process being used, either wettable by solder, or bondable by wire. One such removal process is laser ablation. The removal operation can be readily controlled by adjusting the fluence, wavelength and number of laser pulses or shots used, in order not to damage the electrical line or the via.

In some cases the electrical line beneath the polymer, such as polyimide, is a line, which has a metallurgical stack where the top layer is non-bondable to a metal unless a sub-layer is exposed which is more bondable. This sub-layer could be exposed using laser ablation. In this situation the top layer is typically Cr, and once the polyimide or similar insulator coating is removed, Cr gets oxidized, thus preventing the repair. In such circumstances the laser ablation could be used to remove the oxidized Cr layer and exposing a sub-layer, such as Cu, that can be used to carry out the line repair.

One such cleaning of bonding surfaces using a laser is disclosed in, "Laser Ablative Cleaning of Bonding Surfaces," IBM Technical Disclosure Bulletin, Vol. 32, No. 4A, Pages 429–430 (September 1989).

FIG. 1, illustrates a top view of a typical defect or discontinuity on a semiconductor item 10, such as a Printed Circuit Board, or substrate, such as a ceramic or a glass-ceramic substrate, having at least one via 11. For the ease of illustrating the invention the semiconductor item 10, will hereinafter be referred to as the board 10. An open or defect on the board 10, could be due to a variety of reasons, such as a result of a manufacturing process defect or could be due to a deliberate attempt to fix an electrical connection. On a typical board 10, there are one or more electrical lines that are buried inside the board 10. These buried lines could be a single level line or multi-level line. As illustrated in FIG. 1, the buried wiring line between repair via 12, and repair via 22, is defective, as it is not providing the desired internal electrical connection, therefore, there is a need to establish a direct electrical connection by external means that does not interfere with subsequent processing of the board.

Typically, in order to form a continuous and reliable electrical connection between the vias 12 and 22, the buried wiring line will be destroyed by methods well known in the art. One such method of destroying a buried wiring line is to pass a high electrical current between the two vias 12 and 22, which would result in a permanent open or discontinuity.

Once it has been established that the buried wiring connection does not exist between the vias 12 and 22, a routing groove or trench 14, between the vias 12 and 22, is formed as discussed elsewhere. The trench should be formed so as not to damage the vias 11, adjacent to the trench 14, or any buried electrical lines below the trench 14. A repair foil or wire 16, is then routed through the trench 14, and one end of the repair wire 16, is secured to the repair via 12, while the other end of the wire 16, is secured to the repair via 22, by means well known in the art. Typically, the wire 16, would be secured to the vias 12 and 22, by means of soldering or brazing or other types of electrical and mechanical type bonding or securing methods. As discussed elsewhere the vias 12 and 22, must also be site-dressed to provide a good and reliable electrical and mechanical connection to the repair wire 16. Once the repair wire 16, has made a direct external connection between the vias 12 and 22, the electrical connection can be checked and verified by means well known in the art. Of course, an insulator or a non-electrically conductive polymer type material can also be applied over the board 10, or just the trench 14, in order to protect and secure the wire 16, inside the trench 14.

The material for repair wiring line or foil 16, is typically selected from a group comprising aluminum, antimony, bismuth, chromium, cobalt, copper, gold, indium, iron, lead, molybdenum, nickel, palladium, platinum, silver, tantalum, tin, titanium, tungsten, or alloys thereof. The board 10, could be single layer or multilayer, and the material for the board 10, could be selected from a group consisting of ceramic, glass ceramic, other insulative material, to name a few.

Figure 2:
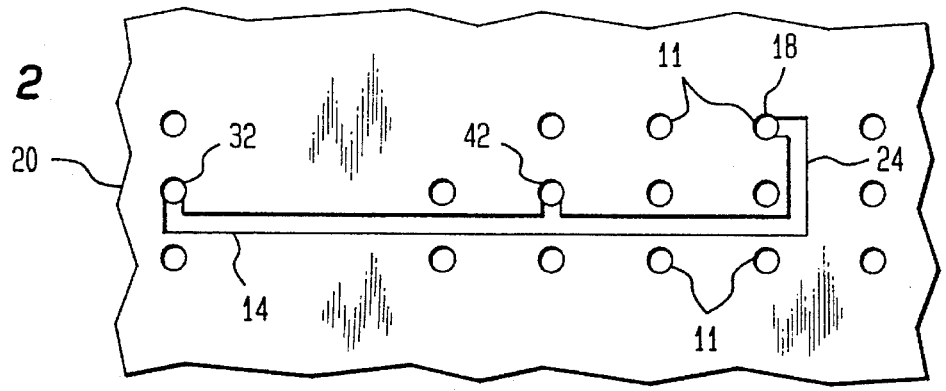
FIGS. 2 and 3, illustrate a top view of process and structure of the preferred embodiment of repairing the defective semiconductor item of this invention.
Figure 3:
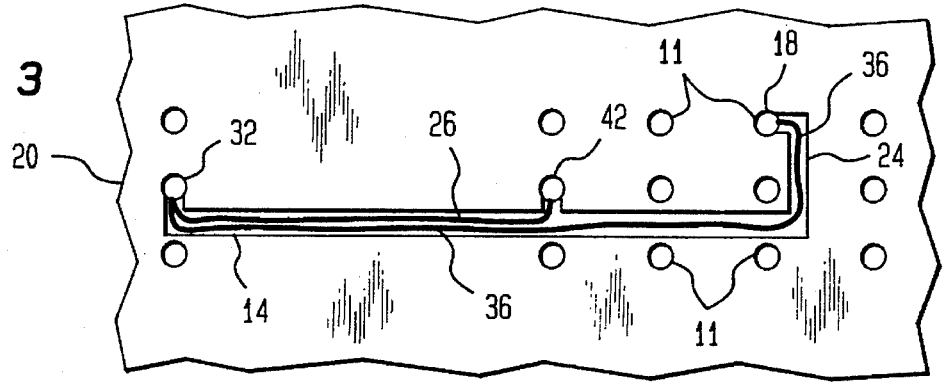

FIGS. 2 and 3, illustrate a top view of process and structure of the preferred embodiment of repairing the defective semiconductor item of this invention. After the defect has been located it can be easily repaired by the method and process illustrated in FIG. 1, however, in some cases it may be necessary to match the impedance of the buried wire that was defective and which was destroyed. FIGS. 2 and 3, illustrate show impedance matching can be achieved by this invention, on a board 20, using double jumper wires. By methods well known in the art and discussed earlier a routing trench 14, is made between a repair via 32 and repair via 42. Both the vias 32 and 42, and the trench 14, are site-dressed as discussed earlier.

After a repair wire or foil 26, is made to provide the direct external electrical connection between the vias 32 and 42, at least one ground via 18, is located that theoretically will provide the impedance match. Using the same methods as used to make the routing trench 14, a ground groove or trench 24, is made typically, between the ground via 18, and repair via 32 or 42. Of course the ground via 18, and the ground trench 24, should be properly site dressed to provide a good mechanical and electrical connection to a ground wire or foil 36, that runs between the ground via 18, and the repair via 32. In order to optimize the real estate on the board 20, the ground trench 24, and the routing trench 14, could overlap for some distance. Of course one can have more than one trench 14 and 24, on the board 20, and similarly a more optimum trench routing could be achieved using more sophisticated computer programs. Furthermore, the trenches 14 and 24, should be wide and deep enough to accommodate the wires 26 and 36, and so as to fully serve their purpose.

The trenches 14 and 24, are typically made using methods well known in the art, such as laser ablation, ion milling, to name a few.

The trenches 14 and 24, are made on the board 20, which is typically an insulator type material, such as ceramic or glass ceramic, and this material is typically much more soft and easy to cut than the metal material used to make the line connections.

Figure 4:
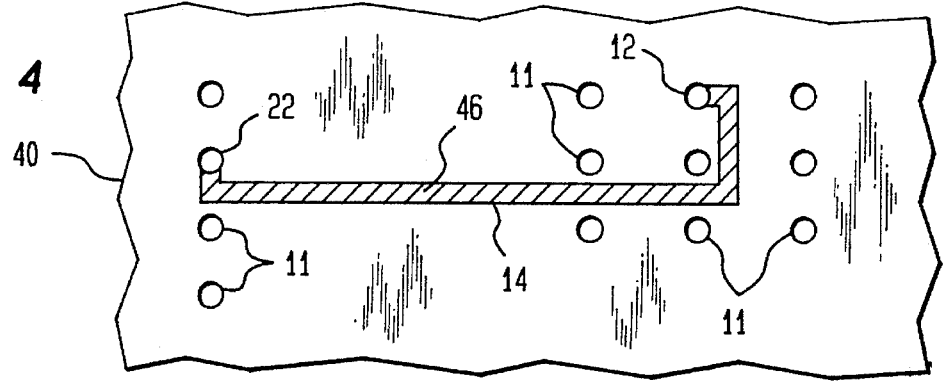
FIG. 4, illustrates a process and structure of another embodiment of repairing the defective semiconductor item of this invention.

FIG. 4, illustrates a process and structure of another embodiment of repairing the defective semiconductor item 40, using this invention. After the area in and around the repair vias 12 and 22, and the routing trench 14, have already been site-dressed, an electrically conductive material 46, such as an electrically conductive paste or epoxy or an adhesive strip, is then made to provide the desired electrical connection via the routing trench 14, by methods well known in the art. Such method could include, using a laser or hot gas reflow method, to name a few, and that the electrically conductive material 46, must physically make an external electrical connection between the two repair vias 12 and 22, and restores electrical connection between the two vias 12 and 22. The excess material from the electrically conductive material 46, is removed by methods well known in the art. The electrically conductive material 46, could be a solder or solder-type material, or an electrically conductive material that can be reflowed without damaging or harming the electrical lines or vias or other items on the board 40. Of course the electrically conductive material 46, could be an electrically conductive material that has a coating of a material that can be reflowed, such as, for example, a solder or a solder-type material.

Of course one could have more electrical lines and other features on the board 10, 20 or 40. The TSL (Top Surface Length) of the trench 14, should be such that it accommodates all of the electrically conductive material 46, flowing into it, and further does not allow the material in it to contact the adjacent electrical items, such as vias 11, and start creating a short.

The electrically conductive material 46, or the wires 16, 26 and 36, could be secured to the vias or the wires, by methods well known in the art, such as the method could be selected from a group comprising ultrasonic bonding, brazing, thermal compression bonding, or lasersonic bonding.

Electrically conductive material 46, such as gold, can be deposited in the trench 14, using the standard prior art method, such as, CVD deposition or laser ablation, to name a few, which results in the gold or electrically conductive metal 46, being deposited in the trench 14, between the vias 12 and 22.

The trench 14, of course has to be deep enough to capture all the electrically conductive material 46, as discussed earlier, so as not to create a problem of the metal or gold forming a bridge between the two adjacent electrical lines or vias.

It was found that deeper grooves or trenches in the board 10, 20 or 40, lead to better results. There may be product or other physical limitations that may exist, however, which may prevent the use of deep grooves 14 or 24, such as thin dielectric material in a multilayer electrical structure or underlying wiring or features being too close to the surface that is being used to form these trenches or grooves 14 or 24. In these cases, a series of two or more shallow grooves 14 or 24, in parallel would also produce the desired effects.

Furthermore, at least a portion of the deposited electrically conductive material 46, or the wires 16, 26 or 36, could be covered with at least one low temperature electrically conductive material, such as, solder, and wherein the low temperature electrically conductive material could be secured to the deposited electrically conductive material by a method selected from hot gas reflow, furnace reflow, thermode, or laser reflow. Moreover, at least a portion of the deposited electrically conductive material could be covered with solder, and wherein the solder could be secured to the electrical line by a method selected from hot gas reflow, furnace reflow, thermode, or laser reflow.

The metallurgical bond that is formed between the deposited electrically conductive material and the electrical line could be by melting of the solder. The electrically conductive material that provides the external electrical connection could be selected from a group comprising an electrically conductive organometallic material or an electrically conductive polymeric material or an electrically conductive epoxy, or an electrically conductive adhesive, to name a few.

After the open has been repaired the further processing of the carrier or substrate could continue normally. For, example, at least a portion of the deposited electrically conductive material or the wires could be covered with at least one insulator material, wherein the insulator material could be polymer. Of course for any subsequent processing it would be advantageous to at least planarize the repaired area so that subsequent levels do not pose any manufacturing or reliability problems.

It would be preferred that the area of the site dressed location is at least 25 percent larger than the average cross-sectional dimensions of the electrical line or the electrically conductive material that is deposited in the trench.

The boards may also be repaired at any time in the assembly process. Repair could take place before the outer coatings are placed on the board.

The routing trench that is machined into the board can be made to accommodate any size wire that is required. The path a trench will take will be to ensure that the trench will not conflict with any SMT (Surface Mounted) devices or other components that may be placed on the board during final assembly. The depth of the trench into the board can also be controlled so as to maintain a uniform distance from ground/power planes.

The type of wire that is used for the repair depends largely on the impedance requirements. The invention allows for the use of both insulated or non-insulated wire, of varying diameters, depending on which type is required for a given repair.

The bonding process is normally conducted using an ultrasonic welding machine. The ultrasonic welding process allows a strong bond to be created without creating a large heat affected area, which may cause damage. Since this process creates a bond using friction, the board should not come in contact with chemical solvents or other cleaning or shielding products.

After the bonding process is complete the wire is routed into the trench and can also be tacked by epoxy. If the board is repaired prior to the final coating being applied the need for epoxy encapsulation may not exist.

Testing conducted on the repaired net will be according to the desired specifications. A typical testing procedure would involve endpoint continuity test of the repaired net, and Time Delay Reflectometry (TDR) to check propagation delay as well as impedance.

This board repair process provides a highly reliable, cost effective solution for repairing all types of circuit boards.

The use of a double jumper wire for repair of impedance specific internal circuitry would eliminate the need for the depth of the wire routing trench to be maintained with extreme precision or to ensure proper distance from the internal planes of the board. This procedure also makes the need to have an exact wire diameter to repair depth ratio non-existent.

Specific impedance requirements are needed on some nets of multi-wire circuit boards to maintain proper electrical signals. Repairing a damaged net, that is impedance specific, results in the need to have a tight tolerance on both the wire diameter and the distance from the center of the wire to the ground plane. By using this double jumper wire repair method, the need for tight tolerances are not necessary.

In order to match the impedance of an internal net, the distance between the wire and the ground plane is critical. Sometimes conditions exist that do not allow the correct distance to be achieved without milling a trench into the board that would result in damage to internal circuitry. A search for a method that would allow an impedance match without causing damage to the internal circuits resulted in the use of a double jumper wire based on the fact that it could solve the problem with a minimum of added expense to the process. Therefore this invention as illustrated provides a method and structure of matching impedance of the jumper wire to that of internal nets.

After the repair has been made, the quality of the repair net is first subjected to a continuity test to ensure that the repair wire made an adequate electrical connection. Next, the impedance of the repair net is monitored using a TDR meter. The double wire repair method of this invention has been found to provide the closest impedance match possible, with a minimum of effort and cost. This inventive process and structure has the added advantage that It does not require high precision tooling.

EXAMPLES

The following examples are intended to further illustrate the invention and are not intended to limit the scope of the invention in any manner.

Examples 1 through 6, disclose a sub-surface PCB repair process where applications do not require impedance matching. Example 7, describes the preferred method of repairing a board while taking into account impedance matching.

EXAMPLE 1

Channels or trenches about 2 to 10 mils wide and 5 mils deep were micro-milled into the PCB and into the surface of the PCB to expose the copper barrel or vias at each end of the line to be repaired. A wire was then press fitted into the channel in lieu of epoxy, and each end of the wire was interconnected to the copper vias using an electrically conductive epoxy. Thus a sub-surface repair was accomplished, and electrical continuity was established between the two copper vias.

EXAMPLE 2

This example is similar to method of Example 1, except that a smaller diameter wire was used and was held in the trench with dabs of non-conductive epoxy. The trench was then encapsulated with a polymer, and excess polymer material was removed, so that the polymer was flush with the surface of the PCB. Here inter-connection to the copper vias were made by either conductive epoxy or ultrasonic bonding.

EXAMPLE 3

The method of Example 3, is similar to the one disclosed for Example 2, except that instead of using a wire, one half of the depth of the trench was filled with an electrically conductive epoxy. The polymer was then placed over the epoxy to seal it. Electrical interconnection between the copper vias was made by the epoxy.

EXAMPLE 4

In this example an electrically conductive copper foil was used in lieu of an electrically conductive paste or wire. The same trench was micro-milled as specified in Example 1, and the electrically conductive copper foil was inserted into the trench. The electrical interconnection to the copper via was accomplished by using an electrically conductive paste as specified in an earlier example. A polymer was then placed atop the copper foil within the trench, such that the polymer was flush with the top of the PCB.

EXAMPLE 5

In this example an electrically conductive adhesive strip, in lieu of a wire, paste, or copper foil, was used. The subsurface trench, interconnection, and the polymer used were the same as specified in Example 2.

EXAMPLE 6

The method of this example was similar to the method of Example 2, except that a flat or rectangular type wire was employed. This flat or rectangular type wire was obtained by flattening a round wire using a press. This allowed for larger diameter wire to be used where trench depth is restricted. 90 degree bends were employed where necessary by flattening the pre-determined shape in a press. Interconnections were made using ultrasonic bonding.

EXAMPLE 7

The preferred repair procedure for the PCB is as follows. A trench was milled into the surface of the board between the two endpoints of the faulty net. Each end of the trench diverged. One end of the trench terminated on the via of the net being repaired, and the other on a ground pin or via of the same array. Next an insulated wire was bonded to the repair via, and a second insulated wire was bonded to the ground via or pin of the array. Then both wires were tacked into the wire routing trench using epoxy. The final step was to bond the second end of the repair wire to the second repair via and the ground wire to the adjacent ground via as before. This resulted in an impedance matched repair.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A repaired structure comprising a carrier having at least one electrical line having a discontinuity and forming at least one first segment and at least one second segment, at least a portion of said first segment and at least a portion of said second segment are exposed, at least one trench in said carrier between the exposed sections of said first segment and said second segment, an electrical connection having a first end and a second end routed through said trench and wherein said first end is secured to at least a portion of said exposed first segment and wherein said second end is secured to at least a portion of said exposed second segment to provide electrical continuity to said defective electrical line and thereby providing said repaired structure.

2. The repaired structure of claim 1, wherein said electrical connection is at least one electrically conductive wire.

3. The repaired structure of claim 1, wherein said electrical connection is at least one electrically conductive media.

4. The repaired structure of claim 3, wherein said electrically conductive media is selected from a group consisting of electrically conductive polymer or an electrically conductive epoxy or an electrically conductive adhesive or an electrically conductive organometallic material.

5. The repaired structure of claim 1, wherein the material for said electrical connection is selected from a group comprising aluminum, antimony, bismuth, chromium, cobalt, copper, gold, indium, iron, lead, molybdenum, nickel, palladium, platinum, silver, tantalum, tin, titanium, tungsten, or alloys thereof.

6. The repaired structure of claim 3, wherein the material for said electrically conductive media is selected from a group comprising aluminum, antimony, bismuth, chromium, cobalt, copper, gold, indium, iron, lead, molybdenum, nickel, palladium, platinum, silver, tantalum, tin, titanium, tungsten, or alloys thereof.

7. The repaired structure of claim 3, wherein said electrically conductive media is selected from a group comprising solder, solder coated metal, or a metal covered with a low temperature electrically conductive material or a foil or a flat wire or a rectangular type wire.

8. The repaired structure of claim 1, wherein said electrical connection is a low temperature electrically conductive material.

9. The repaired structure of claim 1, wherein at least a portion of said electrical connection has a coating of at least one low temperature electrically conductive material.

10. The repaired structure of claim 9, wherein said at least one low temperature electrically conductive material is solder.

11. The repaired structure of claim 1, wherein at least a portion of said electrical connection has a coating of at least one insulator material.

12. The repaired structure of claim 1, wherein at least a portion of said electrical connection has a coating of at least one polymer material.

13. The repaired structure of claim 1, wherein said carrier has at least one second trench having at least one second electrical connection to provide impedance matching.

* * * * *